United States Patent [19]

Hasegawa et al.

[11] Patent Number: 5,795,399
[45] Date of Patent: Aug. 18, 1998

[54] SEMICONDUCTOR DEVICE MANUFACTURING APPARATUS, METHOD FOR REMOVING REACTION PRODUCT, AND METHOD OF SUPPRESSING DEPOSITION OF REACTION PRODUCT

[75] Inventors: Makoto Hasegawa, Kawasaki; Atsuo Sanda, Oita; Haruhiko Nomura, Yokkaichi, all of Japan

[73] Assignee: Kabushiki Kaisha Toshiba, Kawasaki, Japan

[21] Appl. No.: 496,754

[22] Filed: Jun. 29, 1995

[30] Foreign Application Priority Data

Jun. 30, 1994 [JP] Japan .................. 6-150244

[51] Int. Cl.⁶ .................. B08B 6/00; C23F 1/02; B44C 1/22
[52] U.S. Cl. .................. 134/1.3; 156/345; 216/67; 216/71; 118/719
[58] Field of Search .................. 156/345; 216/67, 216/71, 70; 118/719; 134/1.3

[56] References Cited

U.S. PATENT DOCUMENTS

| | | | |
|---|---|---|---|
| 5,277,740 | 1/1994 | Yoneda | 156/345 |
| 5,520,784 | 5/1996 | Ward | 204/192.15 |
| 5,531,862 | 7/1996 | Otsubo et al. | 156/643.1 |

FOREIGN PATENT DOCUMENTS

| | | |
|---|---|---|
| 3613181 | 10/1987 | Germany . |
| 59-004025 | 1/1984 | Japan . |
| 61-203137 | 9/1986 | Japan . |
| 63-034922 | 2/1988 | Japan . |
| 63-099531 | 4/1988 | Japan . |
| 63-72110 | 4/1988 | Japan . |
| 01298169 | 12/1989 | Japan . |
| 01305197 | 12/1989 | Japan . |
| 02039523 | 2/1990 | Japan . |
| 02043359 | 2/1990 | Japan . |
| 02122625 | 5/1990 | Japan . |
| 03205740 | 9/1991 | Japan . |
| 04051519 | 2/1992 | Japan . |
| 04369833 | 12/1992 | Japan . |

*Primary Examiner*—R. Bruce Breneman
*Assistant Examiner*—George Goudreau
*Attorney, Agent, or Firm*—Finnegan, Henderson, Farabow, Garrett & Dunner, L.L.P.

[57] ABSTRACT

A plasma etching apparatus has a first load-lock chamber, a process chamber connected to the first load-lock chamber through a gate valve, and a second load-lock chamber connected to the process chamber through another gate valve. A first processing section is provided to the process chamber to etch a wafer. A second processing section is provided to the second load-lock chamber to remove a reaction product generated during etching from the wafer. In the second processing section, an ultrasonic wave is applied to the wafer, thereby removing the reaction product from the wafer.

18 Claims, 8 Drawing Sheets

| (a) | ETCHING RATE OF POLY-Si WITHOUT VIBRATION APPLIED | 250nm / min |
|---|---|---|
| (b) | ETCHING RATE OF POLY-Si WITH VIBRATION APPLIED | 370nm / min |

F I G. 6

F I G. 7

| | | ETCHING RATE OF WSi | UNIFORMITY |
|---|---|---|---|
| (a) | WITHOUT VIBRATION | 150 nm/min | ±30 % |
| (b) | WITH VIBRATION | 250 nm/min | ±5.0% |

SEMICONDUCTOR DEVICE MANUFACTURING APPARATUS, METHOD FOR REMOVING REACTION PRODUCT, AND METHOD OF SUPPRESSING DEPOSITION OF REACTION PRODUCT

BACKGROUND OF THE INVENTION

1. Field of the Invention

The present invention relates to the manufacture of a semiconductor device and, more particularly, to removal of an undesirable reaction product generated in a wafer process by a chemical reaction, and suppression of deposition of the reaction product.

2. Description of the Related Art

A semiconductor device such as an LSI is formed by subjecting a semiconductor wafer to various types of processing and treating operations, e.g., coating of a photoresist, development of the photoresist, etching, ion implantation, removal of the photoresist, and deposition of a film. In particular, etching and deposition are performed by introducing various types of semiconductor process gases into a process chamber and causing a chemical reaction in the chamber. In the process utilizing such a chemical reaction, a reaction product, e.g., chlorine ($Cl_2$), often remains on the wafer. A reaction product is generally undesirable and is thus removed from the wafer immediately after the process is ended. Typical influences of the reaction product on a semiconductor device are short-circuiting, contamination, corrosion, and the like.

At present, methods of removing a reaction product include a method of evaporating the reaction product by heating the wafer. A wafer heating scheme includes heating using an infrared lamp and heating using a heater.

Figure 1:
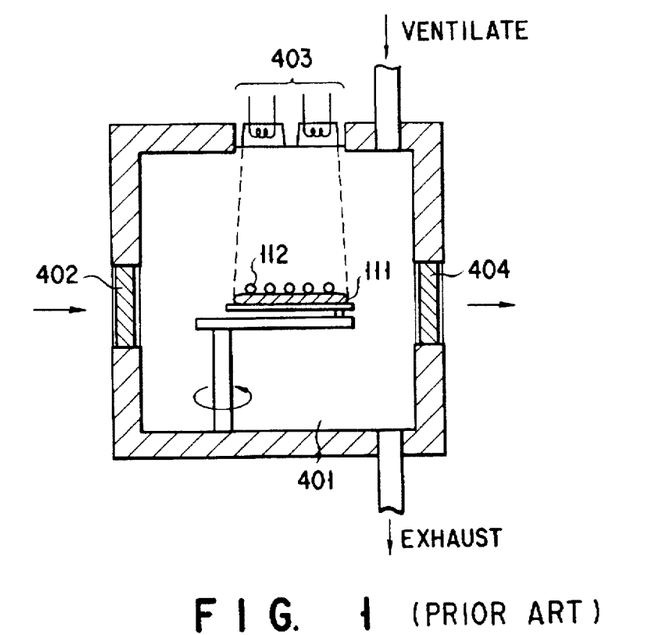
FIG. 1 is a diagram showing the arrangement of an apparatus utilizing a heating scheme using an infrared lamp.

FIG. 1 is a view showing the arrangement of an apparatus that utilizes a heating scheme using an infrared lamp.

As shown in FIG. 1, a load-lock chamber 401 is connected to a vacuum pumping equipment (not shown). A wafer 111 processed in a process chamber (not shown) is loaded in the load-lock chamber 401 through a gate valve 402. When the wafer 111 is loaded in the load-lock chamber 401, the pressure in the load-lock chamber 401 is decreased by evacuating the interior of the load-lock chamber 401 by the vacuum pumping equipment (not shown). The wafer 111 is heated by an infrared lamp 403 at a reduced pressure. A reaction product 112 attaching on the wafer 111 is evaporated by this heating operation. After the reaction product 112 is removed, the load-lock chamber 401 is opened to the outer air by a ventilating equipment (not shown), so that the pressure in it is restored to the atmospheric pressure. Thereafter, the wafer 111 is unloaded from the load-lock chamber 401 through a gate valve 404.

Figure 2:
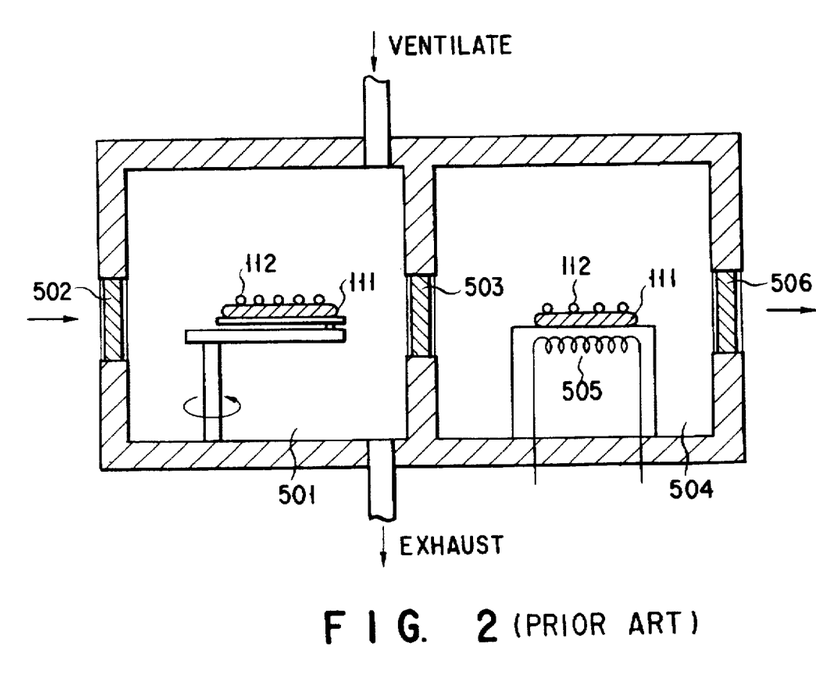
FIG. 2 is a diagram showing the arrangement of an apparatus utilizing a heating scheme using a heater.

FIG. 2 shows the arrangement of an apparatus that utilizes a heating scheme using a heater.

As shown in FIG. 2, a load-lock chamber 501 is connected to a vacuum pumping equipment (not shown). A wafer 111 processed in a process chamber (not shown) is loaded in the load-lock chamber 501 through a gate valve 502. When the wafer 111 is loaded in the load-lock chamber 501, the pressure in the load-lock chamber 501 has been reduced. After the gate valve 502 is closed, the load-lock chamber 501 is opened to the outer air, so that the pressure in the load-lock chamber 501 is restored to the atmospheric pressure. Thereafter, the wafer 111 is loaded in a post-treatment chamber 504 through a gate valve 503. The wafer 111 is heated by a heater 505 under the atmospheric pressure. A reaction product 112 is evaporated from the wafer 111 by this heating operation. After the reaction product 112 is removed, the wafer 111 is unloaded from the post-treatment chamber 504 through a gate valve 506.

In the method of removing the reaction product by heating the wafer, the wafer must be heated to a very high temperature in order to enhance the removing effect. This heating operation has disadvantages as follows.

For example, after the photoresist is developed by chemical dry etching (CDE), when the wafer is heated, the developed photoresist is degraded by the heat. The degraded photoresist no longer serves as the masking member.

After the film or wafer is etched by CDE by using the photoresist as the mask, when the water is heated, the remaining photoresist is denatured by the heat. Sometimes this denatured photoresist portion cannot be completely separated in the succeeding photoresist removing step and remains on the wafer.

The heating operation using an infrared lamp is performed at a reduced pressure, as shown in FIG. 1. On the other hand, the heating operation using a heater is performed at an atmospheric pressure, as shown in FIG. 2. At the reduced pressure, the reaction product can be removed more easily than at the atmospheric pressure, as the reaction product can be evaporated more easily. However, in the heating operation using the infrared lamp, as the heat is transmitted to the wafer by radiation, a very long period of time is necessary until the wafer reaches a sufficiently high temperature.

Regarding this point, in the heating operation using the heater, since the heat is transmitted to the wafer through a metal with a very high thermal conductivity, the wafer reaches a sufficiently high temperature within a comparatively short period of time. At the atmospheric pressure, however, the wafer must be left at a high temperature for a long period of time to sufficiently evaporate the reaction product, which is time-consuming.

As described above, the method of removing the reaction product by heating the wafer causes degradation and denature of the photoresist, making it difficult to manufacture a semiconductor device. Also, removal of the reaction product takes a long period of time. This decreases a throughput, thereby degrading the productivity.

SUMMARY OF THE INVENTION

The present invention has been made in view of the above points. It is the first object of the present invention to provide a semiconductor device manufacturing apparatus capable of removing a reaction product without heating a work, and its removing method.

It is the second object of the present invention to provide a semiconductor device manufacturing apparatus capable of shortening the work process time, and its processing method.

It is the third object of the present invention to provide a semiconductor device manufacturing apparatus capable of suppressing the residual of a reaction product in the device, and its suppressing method.

In order to achieve the first object, with the semiconductor device manufacturing apparatus according to the present invention, a sonic wave is applied to the work after the processing operation. Hence, the reaction product attaching to the work during the processing operation is removed.

In order to achieve the second object, with the semiconductor device manufacturing apparatus according to the present invention, the processing operation is performed while applying a sonic wave to the work. Hence, the processing operation is performed while suppressing deposition of the reaction chamber on the work.

In order to achieve the third object, with the semiconductor device manufacturing apparatus according to the present invention, after the processing operation, a sonic wave is applied to a housing constituting a chamber and pipes connected to the chamber. Hence, the reaction product attaching to the interiors of the housing and pipes during the processing operation is removed. Alternatively, the processing operation is performed while applying an ultrasonic wave to the housing constituting the chamber and the pipes connected to the chamber. Hence, deposition of the reaction chamber on the housing and the pipes is suppressed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

The present invention will be described by way of its preferred embodiments. In this description, note that the common portions are denoted by the common reference numerals throughout the drawings, and a repetitive description will be omitted.

The present invention can be used in the semiconductor device manufacturing apparatus in general as an etching apparatus or by being incorporated in an etching apparatus, as a CVD apparatus or by being incorporated in a CVD apparatus, as an ashing apparatus or by being incorporated in an ashing apparatus, or as a post-treatment apparatus. As preferred embodiments of the present invention, embodiments in which the present invention is incorporated in plasma etching apparatuses will be described.

Figure 3:
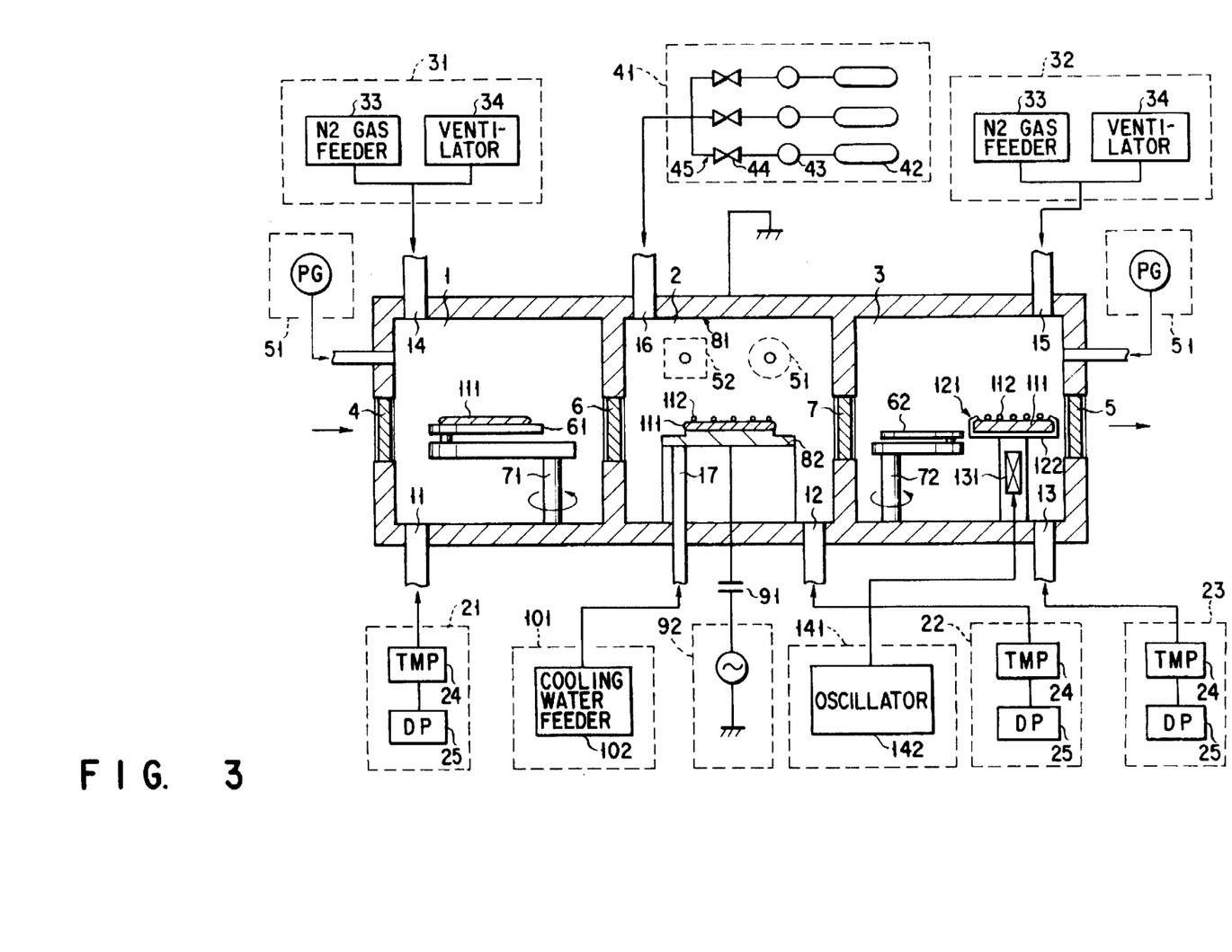
FIG. 3 is a diagram showing the arrangement of a plasma etching apparatus according to the first embodiment of the present invention.

FIG. 3 is a view showing the arrangement of a plasma etching apparatus according to the first embodiment of the present invention.

As shown in FIG. 3, the plasma etching apparatus according to the first embodiment has a first load-lock chamber 1, a process chamber (etching chamber) 2, and a second load-lock chamber 3. The chambers 1, 2, and 3 are partitioned from each other by walls. The first load-lock chamber 1 communicates with the outside of the apparatus through a gate valve 4. The second load-lock chamber 3 communicates with the outside of the apparatus through a gate valve 5. The process chamber 2 communicates with the first load-lock chamber 1 through a gate valve 6 and with the second load-lock chamber 3 through a gate valve 7.

A wafer 111 is first loaded in the first load-lock chamber 1 through the gate valve 4 and is sequentially loaded in the process chamber 2 through the gate valve 6 and in the second load-lock chamber 3 through the gate valve 7. Finally, the wafer 111 is unloaded from the second load-lock chamber 3 through the gate valve 5.

The first load-lock chamber 1 is connected to a first vacuum pumping equipment 21 for reducing the pressure in the load-lock chamber 1 through an exhaust port 11. The process chamber 2 is connected to a second vacuum pumping equipment 22 for reducing the pressure in the process chamber 2 through an exhaust port 12. The second load-lock chamber 3 is connected to a third vacuum pumping equipment 23 for reducing the pressure in the load-lock chamber 3 through an exhaust port 13. Each of the vacuum pumping equipments 21, 22, and 23 includes a turbo molecular pump 24 and a dry vacuum pump 25 connected to the turbo molecular pump 24.

The first load-lock chamber 1 is connected to a first ventilating equipment 31 for ventilating the interior in the load-lock chamber 1 through a ventilating port 14. The second load-lock chamber 3 is similarly connected to a second ventilating equipment 32 for ventilating the interior in the load-lock chamber 3 through a ventilating port 15. Each of the ventilating equipments 31 and 32 includes a nitrogen gas feeder 33 for supplying an inert gas, e.g.r nitrogen gas, to the load-lock chamber 1 or 3, and a ventilator 34 for supplying outer air to the load-lock chamber 1 or 3.

The process chamber 2 is connected to a process gas feeding equipment 41 for introducing a process gas into the process chamber 2 through an introduction port 16. The process gas feeding equipment 41 has reservoirs or cylinders 42 containing gases, flow regulators 43, valves 44, and gas lines 45 connecting the cylinders 42, the flow regulators 43, and the valves 44 with each other. Gas feed systems including the cylinders 42, the flow regulators 43, and the valves 44 are provided in units of types of gases.

As other peripheral equipments, a pressure gauge 51 is provided to each of the first load-lock chamber 1, the process chamber 2, and the third load-lock chamber 3, and a port 52 is provided to the process chamber 2. A mass spectrometer is connected to the port 52. A port 52 is sometimes provided to each of the first and second load-lock chambers 1 and 3 as well.

A line for conveying and processing the wafer will be described.

A first rest table 61 for placing the wafer 111 thereon and a first conveyor 71 for conveying the wafer 111 are installed in the first load-lock chamber 1.

A pair of parallel plate type upper and lower electrodes 81 and 82 are installed in the process chamber 2. An electrostatic chuck (not shown) for fixing the wafer 111 is mounted to the lower electrode 82. When the wafer 111 is fixed on the lower electrode 82 with the electrostatic chuck, a gap is preferably formed between the lower surface of the wafer 111 and the lower electrode 82. When a small amount of helium or nitrogen gas is injected in this gap, heat contact between the wafer 111 and the lower electrode 82 can be improved, thereby facilitating the operation of controlling the wafer 111 to a desired temperature. The upper electrode 81 is connected to the ground potential, and the lower electrode 82 is connected to an RF generator 92 through a blocking capacitor 91. The RF generator 92 generates an RF power of, e.g., 13.56 MHz. The RF power of 13.56 MHz is applied to the lower electrode 82 through the blocking capacitor 91. A cooling pipe 17, through which cooling water for cooling the lower electrode 82 flows, contacts the lower electrode 82. The cooling pipe 17 is connected to a cooling water feeder 102 included in a cooling water feeding equipment 101.

A second rest table 62 for placing the wafer 111 thereon, a second conveyor 72 for conveying the wafer 111, and a support table 122 having a clamp 121 are installed in the second load-lock chamber 3. An ultrasonic vibrator 131 is mounted to the support table 122. The ultrasonic vibrator 131 is connected to an oscillator 142 included in a generator 141 that generates an ultrasonic wave generating electrical signal. The ultrasonic vibrator 131 vibrates upon reception of the electrical signal oscillated by the oscillator 142, thereby generating an ultrasonic wave. The ultrasonic vibrator 131 is buried in, e.g., the support table 122. The material of the support table 122 is selected from metals not harmful to a semiconductor, e.g., a metal containing aluminum oxide as the base material or a metal containing stainless steel as the base material. Vibrations caused by the ultrasonic wave are transmitted to the wafer 111 through the metal, e.g., aluminum oxide or stainless steel.

An example of the operation of this apparatus will be described.

In the above arrangement, first, the gate valve 4 is opened, and the wafer 111 is loaded in the first load-lock chamber 1 and placed on the first rest table 61. After the gate valve 4 is closed, the pressure in the load-lock chamber 1 is decreased by using the first vacuum pumping equipment 21.

Then, the gate valve 6 is opened. In the same manner, the wafer 111 is loaded in the process chamber 2, the pressure in which has been decreased, by using the conveyor 71, and is fixed on the lower electrode 82. After the gate valve 6 is closed, a predetermined etching gas, e.g., a chlorine ($Cl_2$) gas, is introduced into the process chamber 2 through the introduction port 16 at a predetermined flow rate. An RF power is applied to the lower electrode 82 by using the RF generator 92, thereby converting the chlorine gas in the process chamber 2 into a plasma. Thus, the wafer 111 is subjected to a predetermined processing operation, e.g., a polysilicon etching operation. In this operation, a large amount of chlorine remaining as the reaction product 112 attaches to the surface of the wafer 111.

After the processing operation is ended, the gate valve 7 is opened, and by using the conveyor 72, the wafer 111 is loaded in the second load-lock chamber 3 whose pressure has been reduced. The wafer 111 is placed on the rest table 62. The gate valve 7 is closed, and nitrogen gas, e.g., dry nitrogen gas, is supplied into the load-lock chamber 3 through the ventilating port 15, in order to replace the atmosphere in the load-lock chamber 3 with nitrogen ($N_2$). Subsequently, the wafer 111 is placed on the reaction product 112 by using the conveyor 72 and fixed by the clamp 121. The load-lock chamber 3 is opened to the outer air to substitute the atmosphere in the load-lock chamber 3 with the outer air and restore the pressure in the load-lock chamber 3 to the atmospheric pressure. Then, the oscillator 142 is caused to oscillate an electrical signal to generate an ultrasonic wave having a frequency of 45 kHz by the ultrasonic vibrator 131 for 1 minute. This ultrasonic wave is transmitted to the wafer 111 through the support table 122. As a result, the residual chlorine as the reaction product 112 is removed from the wafer 111.

The wafer 111 is clamped by the clamp 121 so that vibrations caused by the ultrasonic wave are efficiently transmitted to the wafer 111.

Figure 4:
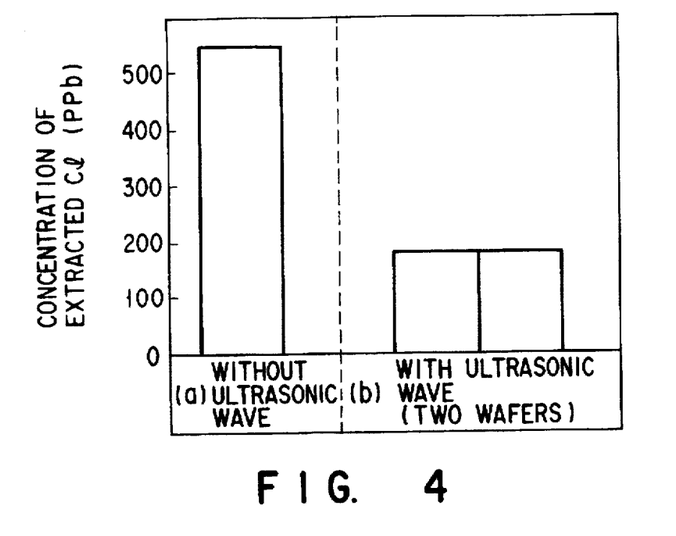
FIG. 4 is a graph showing the concentration of residual chlorine extracted from the wafer.

FIG. 4 is a graph showing the concentration of the residual chlorine extracted from the wafer.

A column (a) of FIG. 4 shows residual chlorine extracted from a wafer subjected to plasma processing using chlorine ($Cl_2$), and a column (b) of FIG. 4 shows residual chlorine extracted from a wafer subjected to plasma processing using chlorine ($Cl_2$) and thereafter ultrasonic processing for 1 minute. The concentration of the residual chlorine shown in FIG. 4 is obtained by extracting the residual chlorine into deionized water and determining the amount of extracted residual chlorine. The unit of determination is part per billion.

As shown in FIG. 4, after plasma processing using chlorine was performed, when the wafer was not subjected to ultrasonic processing, 550 ppb of residual chlorine were extracted from the wafer. In contrast to this, after plasma processing using chlorine was performed, when the wafer was further subjected to ultrasonic processing for 1 minute, only 180 ppb of residual chlorine were extracted.

In this manner, in the wafer subjected to ultrasonic processing, the amount of residual chlorine was decreased to about ⅓ that of a wafer not subjected to ultrasonic processing.

As described above, in the plasma etching apparatus according to the first embodiment of the present invention, the support table 122 to which the ultrasonic vibrator 131 is mounted is provided to the second load-lock chamber 3. The wafer 111 is fixed on the support table 122, and an ultrasonic wave is applied to the wafer 111.

With these apparatus and method, the reaction product 112 can be removed from the wafer 111 without heating the wafer 111 to a high temperature. From this advantage, even after a mask pattern is formed on the wafer 111 by a resist, the reaction product 112 can be removed from the wafer 111 without degrading the pattern. Therefore, after the reaction product 112 is removed, the wafer 111 can be subjected to high-precision ion implantation or high-precision etching.

Even after the mask pattern using the photoresist is used, the reaction product 112 can be removed from the wafer 111 without denaturing the photoresist. Therefore, after the reaction product 112 is removed, the resist can be completely removed from the upper portion of the wafer 111.

With the above apparatus and method, the reaction product 112 is removed within a short period of time. As a result, a decrease in throughput can be prevented.

The plasma etching apparatus according to the first embodiment of the present invention and its etching method can be modified as follows.

A support table 122 to which an ultrasonic vibrator 131 is mounted may be provided to, e.g., a process chamber 2, and a reaction product 112 may be removed from a wafer 111 in the process chamber 2.

A support table 122 to which an ultrasonic vibrator 131 is mounted may be provided on a lower electrode 82 provided in a process chamber 2.

An ultrasonic wave is applied to the wafer 111 at an atmospheric pressure. However, an ultrasonic wave may be applied to the wafer 111 at a reduced pressure. In particular, when an ultrasonic wave is applied to the wafer 111 at a reduced pressure, evaporation of the reaction product 112 may become more active. Thus, an improvement of the effect of removing the reaction product 112 is more expected.

An ultrasonic wave is applied to the wafer 111 in an outer air. However, an ultrasonic wave may be applied to the wafer 111 in an inert gas, e.g., nitrogen gas. The reaction product 112 can be removed from the wafer 111 also in this manner.

$Cl_2$ gas is used as the etching gas. $Cl_2$ gas is one of polysilicon etching gases. The present invention can be used not only for post treatment performed after etching a silicon-based film, e.g., a polysilicon film, but also for post treatment performed after etching a metal-based film represented by, e.g., molybdenum, molybdenum silicide, tungsten, tungsten silicide, and aluminum films.

The etching gas is not limited to $Cl_2$ gas, but various types of gases, e.g., carbon tetrafluoride gas ($CF_4$, flon 14), carbon tetrachloride gas ($CCl_4$), and hydrogen bromide gas (HBr), may be used.

The first embodiment of the present invention can be used not only for post treatment in the etching process but also for post treatment in, e.g., the CVD process or ashing process in which a reaction product is generated by a reaction.

For example, when the present invention is employed in the CVD process, the support table 122 (shown in FIG. 3) to which the ultrasonic vibrator 131 is provided is provided in either a process chamber (reaction chamber) used for depositing a film or a load-lock chamber connected to the process chamber through a gate valve in the CVD apparatus.

Similarly, when the present invention is employed in the ashing process, the support table 122 (shown in FIG. 3) to which the ultrasonic vibrator 131 is mounted is provided in either a process chamber (ashing chamber) used for ashing a resist or a load-lock chamber connected to the process chamber through a gate valve in an ashing apparatus.

The present invention is not limited to plasma etching but can also be used in post treatment performed after different dry etching.

The reaction product 112 that can be removed by the present invention can be a fluorine (F)-based compound, a bromine (Br)-based compound, or an iodine (I)-based compound in addition to chlorine or a chlorine-based compound. More specifically, the reaction product 112 can be removed from the wafer 111 by the present invention as far as it is a single material including at least one halogen element or a compound thereof.

Furthermore, hydrocarbon ($C_nH_m$), a hydrocarbonbased compound, carbon fluoride ($C_xF_y$), a carbon fluoride-based compound, and the like can also be removed by the present invention.

A plasma etching apparatus according to the second embodiment of the present invention will be described.

The present inventors have obtained another novel plasma etching apparatus from a knowledge obtained in a process of achieving an object of removing a reaction product without heating a wafer, that is, from the knowledge that a reaction product can be removed by applying an ultrasonic wave to a wafer. With this novel plasma etching apparatus, the etching time of the wafer can be shortened and uniform etching can be performed, which are useful effects. More specifically, with the plasma etching apparatus according to the second embodiment of the present invention, when a wafer is subjected to plasma etching while applying an ultrasonic wave to the wafer, deposition of a reaction product on the wafer during plasma etching is suppressed.

Figure 5:
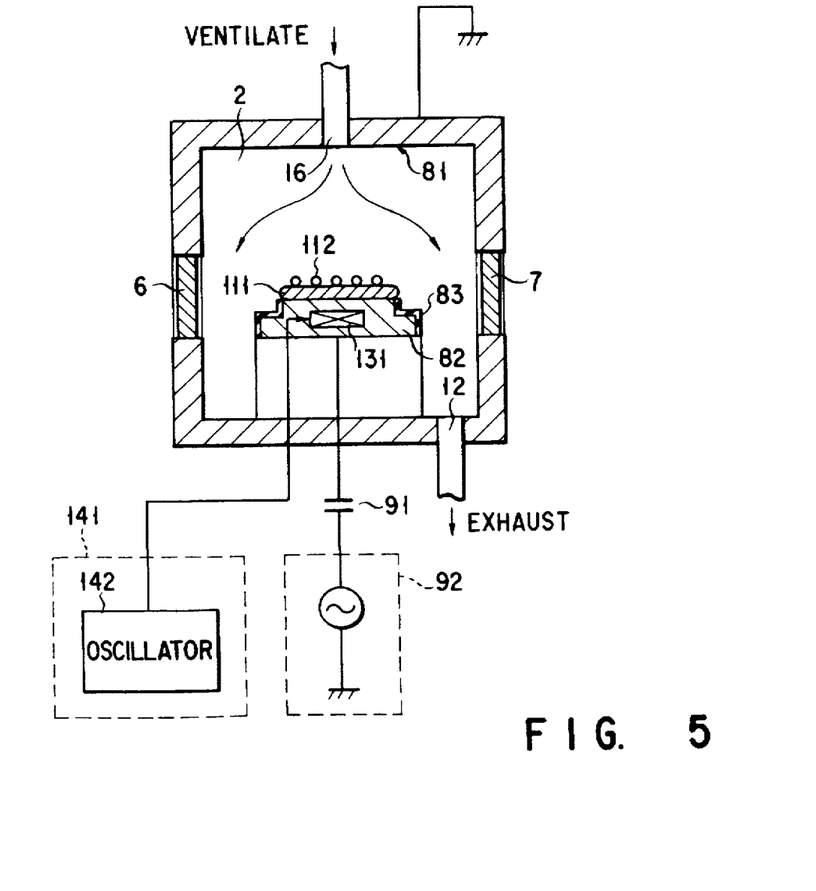
FIG. 5 is a diagram showing the arrangement of a plasma etching apparatus according to the second embodiment of the present invention.

FIG. 5 shows the arrangement of the plasma etching apparatus according to the second embodiment of the present invention.

As shown in FIG. 5, this plasma etching apparatus has a lower electrode 82 having an ultrasonic vibrator 131. The ultrasonic vibrator 131 is connected to an oscillator 142 included in a generator 141 for generating an ultrasonic wave generating electrical signal. The ultrasonic vibrator 131 vibrates upon reception of the electrical signal oscillated by the oscillator 142, thereby generating an ultrasonic wave. The ultrasonic vibrator 131 is buried in, e.g., the lower electrode 82. The material of the lower electrode 82 is, e.g., a metal containing aluminum as the base material. A surface of the lower electrode 82 excluding the contact surface with the wafer 111 is coated with an inert aluminum oxide film 83. Vibrations caused by the ultrasonic wave are transmitted to the wafer 111 through the metal, e.g., aluminum.

An example of the operation of this apparatus will be described.

In the above arrangement, first, a gate valve 6 is opened, and the wafer 111 is loaded in a process chamber 2 by using a conveyor 71 as shown in FIG. 3 and is fixed on the lower electrode 82. An example of this fixing scheme is electrostatic chucking. The gate valve 6 is closed, and an electrical signal is generated by the oscillator 142, so that an ultrasonic wave having a frequency of 45 kHz is generated by the ultrasonic vibrator 131. This ultrasonic wave is transmitted to the wafer 111 through the lower electrode 82. Subsequently, the atmosphere in the process chamber 2 is evacuated to decrease the pressure in the process chamber 2. A predetermined etching gas, e.g., chlorine ($Cl_2$) gas, is introduced into the process chamber 2 through an introduction port 16 at a predetermined flow rate. Then, an RF power is applied to the lower electrode 82 by using an RF generator 92, thereby converting the chlorine gas in the process chamber 2 into a plasma. Thus, the wafer 111 is subjected to predetermined processing, e.g., polysilicon dry etching. After the processing operation is ended, generation of the ultrasonic wave is stopped.

Figure 6:
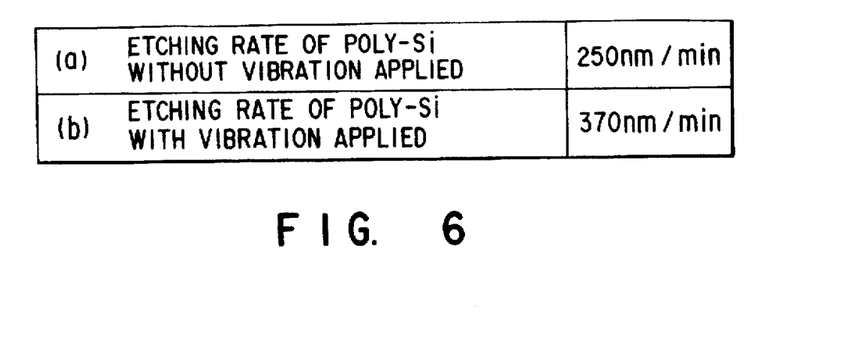
FIG. 6 is a table showing the etching rate of polysilicon.

FIG. 6 is a table showing the etching rate of polysilicon.

A column (a) of FIG. 6 shows the etching rate obtained when polysilicon is etched by using a conventional plasma etching apparatus, and a column (b) of FIG. 6 shows the etching rate obtained when polysilicon is etched by using the plasma etching apparatus shown in FIG. 5.

As shown in FIG. 6, when etching was performed without applying an ultrasonic wave to the wafer, the etching rate of polysilicon was 250 nm/min. In contrast to this, when etching was performed while applying an ultrasonic wave to the wafer, the etching rate of polysilicon was 370 nm/min. In this manner, when etching was performed while applying an ultrasonic wave to the wafer, the etching rate was increased by about 1.5 times.

Also, it had become apparent that etching was uniformly performed on the wafer by employing the plasma etching apparatus shown in FIG. 5.

Figure 7:
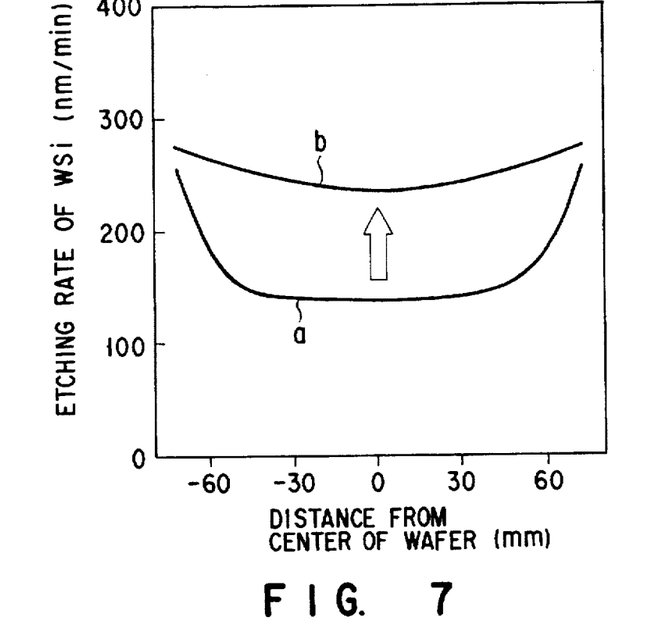
FIG. 7 is a graph showing the distribution of the etching rate of tungsten silicide on the wafer.

FIG. 7 is a graph showing the etching rate distribution of tungsten silicide on the wafer.

The axis of ordinate in FIG. 7 represents the etching rate of tungsten silicide, and the axis of abscissa in FIG. 7 represents a distance from the center of the wafer. A curve (a) indicates the in-plane distribution of etching rates obtained when tungsten silicide is etched by using a conventional plasma etching apparatus, and a curve (b) indicates the in-plane distribution of etching rates obtained when tungsten silicide is etched by using the plasma etching apparatus shown in FIG. 5.

As shown in FIG. 7, when etching is performed without applying an ultrasonic wave to the wafer, a difference between the etching rate of tungsten silicide existing at the central portion of the wafer and the etching rate of the same existing at the edge portion of the wafer is large. In contrast to this, when etching is performed while applying an ultrasonic wave to the wafer, the etching rate of tungsten silicide existing at the central portion of the wafer becomes especially high, so that the difference between this etching rate and the etching rate of tungsten silicide existing at the edge portion of the wafer becomes small, as indicated by the curve (b). In addition, the etching rate of tungsten silicide is increased throughout the entire area of the wafer.

The present inventors explain this phenomenon as follows.

The amount of deposited reaction product is nonuniform within the surface of the wafer. More specifically, a larger amount of reaction product is deposited on the central portion of the wafer than at the edge portion of the wafer. Etching of tungsten silicide existing at the central portion of the wafer is interfered with by this nonuniform deposition of the reaction product, and the etching rate of tungsten silicide existing at this portion becomes lower than that of tungsten silicide existing at the edge portion of the wafer.

The present inventors explain nonuniform deposition of the reaction product as follows.

Tungsten silicide $WSi_x$ (x=2.0 to 3.0) undergoes plasma processing by employing, e.g., a halogen-based gas, and is etched. During this plasma etching, a reaction product having a very low vapor pressure, e.g., $WCl_x$, is generated on the wafer. The halogen-based gas fed into the process chamber is injected toward the center of the process surface of the wafer, flows to spread from this portion toward the edge portion of the wafer, and is finally discharged through the exhaust port. At this time, the reaction product described above is also discharged. Closer to the exhaust port the reaction product on the wafer, more actively it is discharged. The exhaust port is close to the edge portion of the wafer. In contrast to this, the central portion of the wafer is far from the exhaust port, and thus the reaction product generated at this portion is not easily discharged. The non-discharged reaction product is deposited on the process surface of the wafer.

This leads to the conclusion that the reaction product is not easily deposited on the edge portion of the wafer while it is easily deposited on the central portion of the wafer. Nonuniform deposition of the reaction product is thus explained.

Accordingly, it can be concluded that, when the conventional plasma etching apparatus is employed, the etching rate of tungsten silicide is high at the edge portion of the wafer, and low at the central portion of the wafer, as indicated by the curve (a) of FIG. 7.

In contrast to this, when plasma processing is performed by employing the plasma etching apparatus shown in FIG. 5 while applying an ultrasonic wave to the wafer, deposition of a reaction product generated during plasma processing on the process surface of the wafer is suppressed. In particular, deposition of the reaction product can be suppressed at the central portion of the wafer which is far from the exhaust port. When deposition of the reaction product on the central portion of the wafer is suppressed, the etching rate of tungsten silicide existing at this central portion of the wafer is greatly increased.

Therefore, when tungsten silicide is etched by employing the plasma etching apparatus shown in FIG. 5 while applying an ultrasonic wave to the wafer, the etching rate is high at the central portion of the wafer, and thus the difference between this etching rate and the etching rate obtained at the edge portion of the wafer is decreased, as indicated by the curve (b) of FIG. 7. When the difference in etching rate is decreased, the etching rate distribution on the process surface of the wafer can be uniformed.

Since processing is performed while applying an ultrasonic wave to the wafer, deposition of the reaction product is also suppressed at the edge portion of the wafer. As a result, the etching rate of tungsten silicide is increased throughout the entire area of the wafer.

Figure 8:
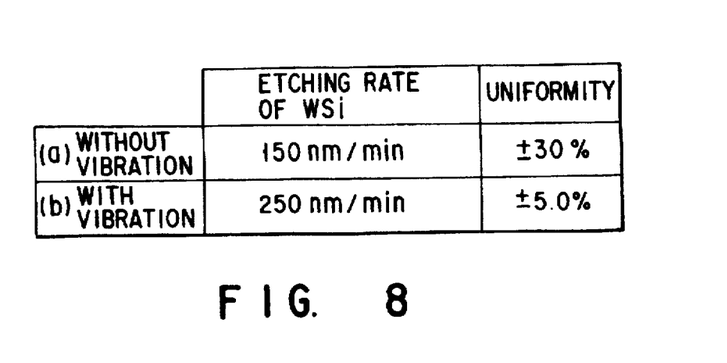
FIG. 8 is a table showing the etching rate of tungsten silicide and the etching uniformity.

FIG. 8 is a table showing the etching rate of tungsten silicide and the uniformity of etching.

A column (a) of FIG. 8 shows values representing the etching rate and uniformity of etching, respectively, obtained when tungsten silicide is etched by employing a conventional plasma etching apparatus, and a column (b) of FIG. 8 shows values representing the etching rate and uniformity of etching, respectively, obtained when tungsten silicide is etched by employing the plasma etching apparatus shown in FIG. 5.

As shown in FIG. 8, when etching was performed without applying an ultrasonic wave to the wafer, the etching rate of tungsten silicide was 150 nm/mmn (average). In contrast to this, when etching was performed while applying an ultrasonic wave to the wafer, the etching rate of tungsten silicide was increased to 250 nm/min (average).

The thickness of tungsten silicide remaining after etching was ended was examined. With the conventional plasma etching apparatus, variations of ±30% from a target thickness were observed. In contrast to this, with the apparatus shown in FIG. 5, the variations were suppressed to ±5%.

The plasma etching apparatus according to the second embodiment of the present invention and its etching method can provide an enhanced effect when the pressure in the process chamber 2 during processing is set to be equal to or higher than the vapor pressure of a reaction product generated by the reaction.

If the pressure in the process chamber 2 during processing is lower than the vapor pressure of the reaction product, the reaction product is evaporated and thus is not substantially deposited on the wafer.

From these facts, the plasma etching apparatus according to the second embodiment of the present invention and its etching method have a large advantage of suppressing deposition of a reaction product which has a low vapor pressure and is thus cannot be easily evaporated.

The plasma etching apparatus according to the second embodiment and its etching method can be modified in the following manner.

Plasma etching is started after application of an ultrasonic wave to the wafer 111 is started, and application of the ultrasonic wave is stopped after plasma etching is ended. However, application of an ultrasonic wave to the wafer 111 may be started when an arbitrary period of time has elapsed after the start of plasma etching, application of the ultrasonic wave may be stopped when an arbitrary period of time has elapsed after the start of application of the ultrasonic wave to the wafer 111, and thereafter plasma etching may be ended.

The second embodiment exemplifies a case wherein polysilicon or tungsten silicide (WSi) was subjected to plasma etching. However, the material to be etched is not limited to a silicon-based material, but a metal-based film represented by molybdenum, molybdenum silicide, tungsten, tungsten silicide, and aluminum films can also be subjected to etching.

The second embodiment of the present invention can be applied not only to etching but also to ashing.

A chamber according to the third embodiment of the present invention, which can be used in the manufacture of a semiconductor device, will be described.

The present inventors have obtained a novel chamber from the knowledge that a reaction product can be removed by applying an ultrasonic wave. With this novel chamber, effects that the water content remaining in the chamber can be easily exhausted, and the like were obtained.

Figure 9:
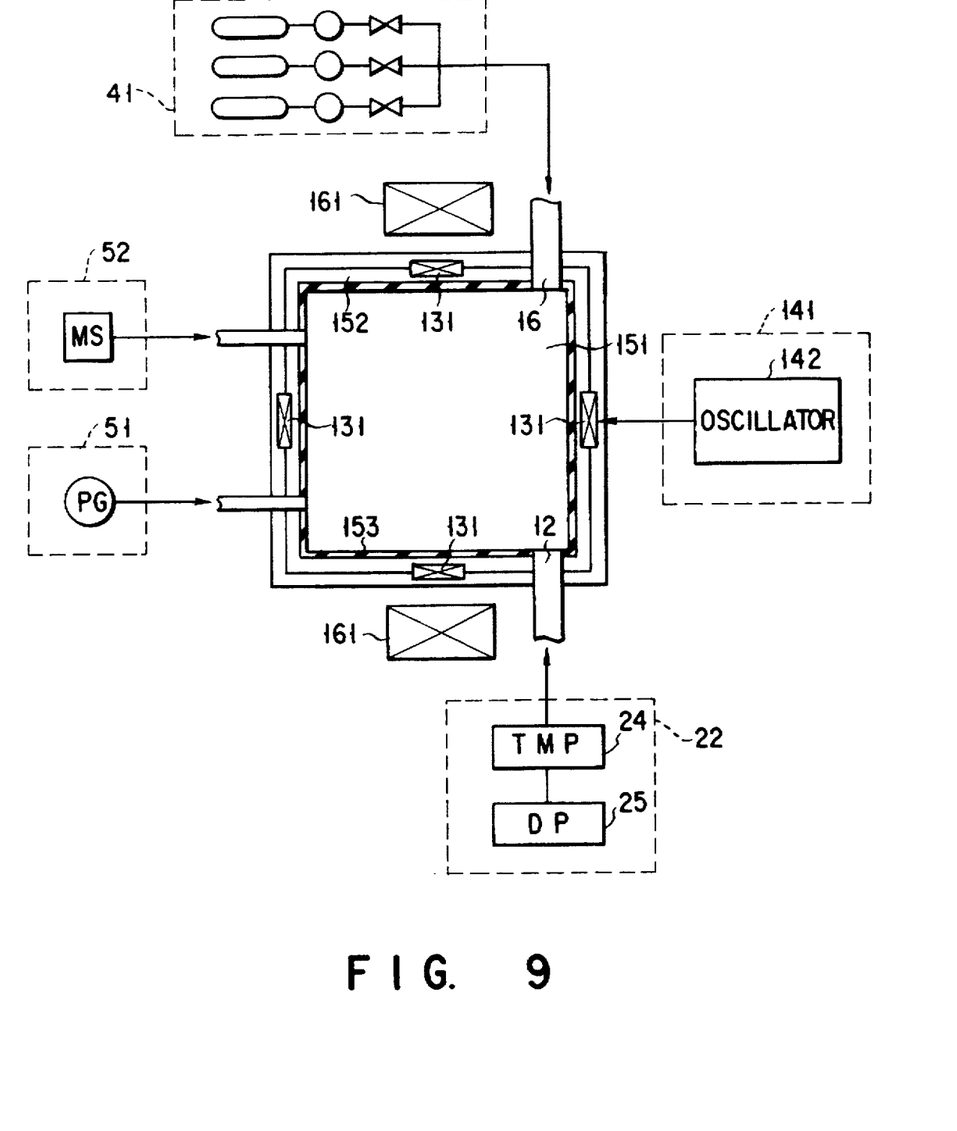
FIG. 9 is a diagram showing the arrangement of a chamber that can be used in the manufacture of a semiconductor device according to the third embodiment of the present invention.

FIG. 9 shows the arrangement of the chamber according to the third embodiment of the present invention, which can be used in the manufacture of a semiconductor device.

A chamber 151 is shown in FIG. 9. The chamber 151 fabricated by the present inventors has a small size. However, if the size of the chamber 151 is increased and an etching apparatus is installed in the chamber 151, this chamber 151 can serve as a process chamber that can perform etching. If a CVD apparatus is installed in the chamber 151, the chamber 151 can serve as a process chamber that can perform CVD processing. If an ashing apparatus is installed in the chamber 151, the chamber 151 can serve as a process chamber that can perform ashing. The chamber 151 can also be used as a simple load-lock chamber.

A vacuum pumping equipment 22, a process gas feeding equipment 41, a pressure gauge 51, and a port 52 to which a mass spectrometer is mounted, are connected to the chamber 151 as the peripheral equipments.

An ultrasonic vibrator 131 is mounted to a housing 152 that constitutes the chamber 151. The ultrasonic vibrator 131 is connected to an oscillator 142 included in a generator 141 for generating an ultrasonic wave generating electrical signal. The ultrasonic vibrator 131 vibrates upon reception of the electrical signal oscillated by the oscillator 142, thereby generating an ultrasonic wave. For example, the ultrasonic vibrators 131 are buried in the housing 152 in an dispersed manner, and the dispersed ultrasonic vibrators 131 are connected to each other. The ultrasonic vibrators 131 may be arranged in, e.g., the walls and ceiling of the housing 152.

The material of the housing 152 is, e.g., a metal containing aluminum as the base material, or a metal containing stainless steel as the base material. A portion of the housing 152 which is exposed to the processing atmosphere is coated with an inert aluminum oxide film 153. Vibrations caused by the ultrasonic wave are transmitted to the entire portion of the housing 152 through the metal of the housing 152. A heater 161 is provided on the outside of the housing 152. The heater 161 heats the interior of the chamber 151 to an arbitrary temperature through the housing 152.

An example of a method of operating the chamber will be described.

Dry nitrogen is supplied into the chamber 151 through an introduction port 16 to set the pressure in the chamber 151 to the outer pressure. Subsequently, an electrical signal is oscillated by the oscillator 142, so that the ultrasonic vibrator 131 generates an ultrasonic wave having a frequency of 45 kHz. This ultrasonic wave is transmitted to the entire portion of the housing 152. In this state, the interior of the chamber 151 is evacuated by using a turbo molecular pump 24 and a dry vacuum pump 25.

By using the chamber 151 shown in FIG. 9, the present inventors conducted a comparative experiment concerning a decrease in water content remaining in the chamber 151.

This comparative experiment was conducted in accordance with the following procedure.

(1) A surface of the housing 152 opposing the chamber 151 (a surface coated with the aluminum oxide film 153; to be referred to as an inside surface hereinafter) is wiped with a cloth wetted with deionized water.

(2) In order to make the atmosphere in the chamber 151 equal for the purpose of comparison, the atmosphere in the chamber 151 is evacuated, and dry nitrogen is supplied into the chamber 151, so that a nitrogen atmosphere is set in the chamber 151 and that the pressure in the chamber 151 is restored to the atmospheric pressure.

(3) The pressure in the chamber 151 is decreased by using the turbo molecular pump 24 and the dry vacuum pump 25 while controlling the heater 161 so as to maintain the temperature in the chamber 151 at 80° C.

(3') The pressure in the chamber 151 is decreased by using the turbo molecular pump 24 and the dry vacuum pump 25 while applying an ultrasonic wave to the housing 152.

Figure 10:
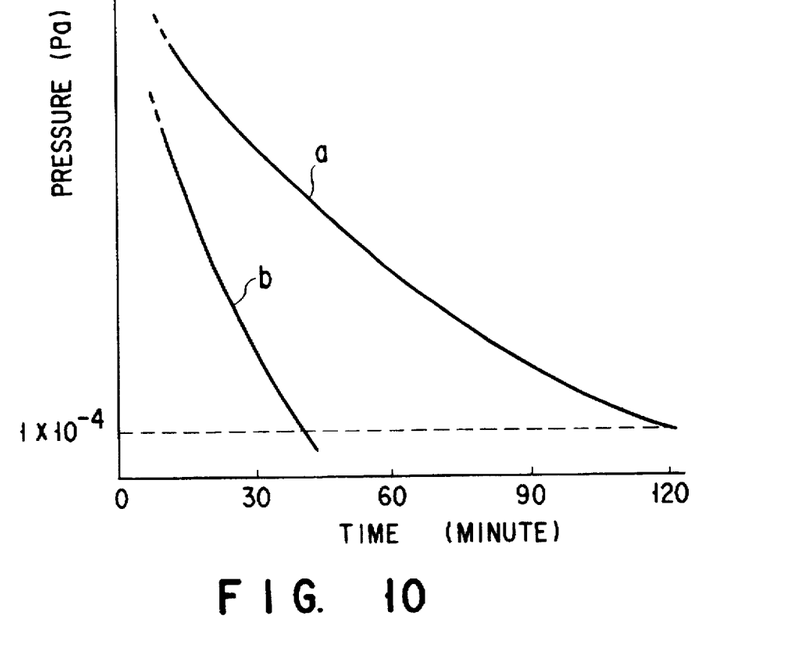
FIG. 10 is a graph showing a decrease in pressure in the chamber.

FIG. 10 is a graph showing the relationship between the pressure in the chamber and time.

The axis of ordinate of FIG. 10 represents the pressure in the chamber, and the axis of abscissa of FIG. 10 represents time. Note that since the pressure in the chamber indicates the amount of all the materials existing in the chamber, it can be assumed that the lower the pressure in the chamber, the smaller the amount of water content remaining in the chamber 151.

A curve (a) of FIG. 10 indicates the result of an experiment conducted in the order of steps (1), (2), and (3), and a curve (b) of FIG. 10 indicates the result of an experiment conducted in the order of steps (1), (2), and (3)'.

As shown in FIG. 10, with the evacuating method performed while heating the interior of the chamber 151, it took about 120 minutes for the pressure in the chamber 151 to reach $1\times10^{-4}$ Pa, as indicated by the curve (a). In contrast to this, with the evacuating method performed while applying an ultrasonic wave to the housing 152, the pressure in the chamber 151 reached $1\times10^{-4}$ Pa within about 40 minutes, as indicated by the curve (b).

In this manner, with the evacuating method performed while applying the ultrasonic wave to the housing 152, the time required for the pressure in the chamber 151 to reach $1\times10^{-4}$ Pa was shortened to about ⅓ that obtained with the evacuating method performed while heating the interior of the chamber 151.

We explain this difference as follows.

With the method wherein heat is externally applied to the chamber 151, it takes time to heat the inside surface of the housing 152. The water molecules attaching to the inside surface cannot be easily evaporated unless the inside surface is sufficiently heated.

In contrast to this, when an ultrasonic wave is applied to the housing 152, the inside surface of the housing 152 vibrates. The water molecules attaching to the inside surface also vibrate. The water molecules that vibrate can be evaporated more easily than water molecules that do not vibrate. The evaporated water molecules can be easily discharged outside the chamber 151 than liquid water molecules. Therefore, when an ultrasonic wave is applied to the housing 152, the water content remaining in the chamber 151 can be discharged within a shorter period of time.

Furthermore, by using the chamber 151 shown in FIG. 9, the present inventors have conducted another comparative experiment concerning a decrease in water content remaining in the chamber 151.

The procedure of this another comparative example is as follows.

(1) The interior of the chamber 151 is opened to the outer air, and is left still for 1 hour. (1') The interior of the chamber 151 is opened to the outer air, and is left still for 1 hour while applying an ultrasonic wave to the housing 152.

(2) After the interior of the chamber 151 is left still in the outer air for 1 hour, it is evacuated.

Figure 11:
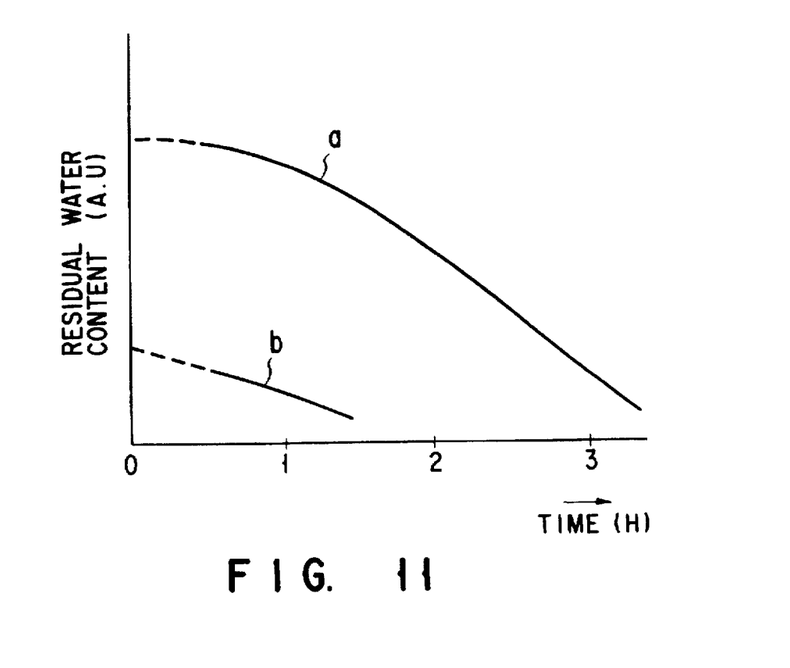
FIG. 11 is a graph showing a decrease in water content remaining in the chamber.

FIG. 11 is a graph showing the relationship between the water content remaining in the chamber and time. The axis of ordinate of FIG. 11 represents the amount of water content remaining in the chamber, and the axis of abscissa of FIG. 11 represents time. The "zero" point on the axis of abscissa indicates the end time at which the interior has been left still for 1 hour. The "1", "2", and "3" points on the axis of abscissa respectively indicate time elapsed after the start of evacuation. The amount of water content represented by the axis of ordinate is measured by a mass spectrometer. The spectrometer indicates the mass of water existing in the chamber 151 from the intensity of the current. The intensity of the current is replaced by the amount of remaining water content and represented by the axis of ordinate of FIG. 11. Although the amount of water content in FIG. 11 is given in arbitrary unit (A. U.) as it is not converted from the unit of the current, FIG. 11 clearly shows the amount of water content and the decreasing tendency of the water content obtained after the interior of the chamber 151 is left.

A curve (a) of FIG. 11 indicates the result of an experiment conducted in the order of steps (1) and (2), and a curve (b) of FIG. 11 indicates the result of an experiment conducted in the order of steps (1') and (2).

As is indicated by the curve (b) of FIG. 11, when an ultrasonic wave is applied to the housing 152, the amount of water content remaining in the chamber 151 becomes about ⅓ that obtained when no ultrasonic wave is applied (curve (a)). This is obvious when the time is 0. After this, the chamber 151 is evacuated to further discharge water content from the chamber 151.

From these experiments, it has become apparent that the water content in the chamber 151 is decreased also by applying an ultrasonic wave to the housing 152 while the chamber 151 is open to the outer air.

We explain this phenomenon as follows.

When an ultrasonic wave is applied to the housing 152, the inside surface of the housing 152 is vibrated, and the water content in the outer air does not easily attach to the inside surface. Even if the water content in the outer air attaches to the inside surface, since the inside surface vibrates, it quickly separates from the inside surface. In this manner, the water content does not attach to the inside surface, thereby suppressing the water content from remaining in the chamber 151.

With the chamber 151 shown in FIG. 9, the water content remaining in the chamber 151 can be removed within a shorter period of time by evacuating the interior of the housing 152 or opening the interior of the housing 152 to the outer air while applying an ultrasonic wave to the housing 152.

Since the pressure can be decreased more quickly, the evacuation time can be shortened. Therefore, when an etching apparatus, a CVD apparatus, an ashing apparatus, and other manufacturing apparatuses for manufacturing a semiconductor device are fabricated by using the chamber according to the third embodiment, manufacturing apparatuses capable of shortening the total process time including the evacuation time, processing time, and the like can be obtained. When the processing time is shortened, the throughput can be increased, further improving the productivity of semiconductor devices.

The chamber 151 shown in FIG. 9 has a small size and a small heat capacity. An actual manufacturing apparatus, however, has a larger size and a larger heat capacity than those of the chamber 151 shown in FIG. 9. Therefore, with the actual manufacturing apparatus, a larger effect than those shown in FIGS. 10 and 11 can be expected. In practice, as shown in FIG. 10, although the time required for the pressure in the chamber to be decreased to $1\times10^{-4}$ Pa can be shortened to ⅓, it can be further shortened to ¼, ⅕, or shorter.

In a chamber (manufacturing apparatus) employing the method of applying an ultrasonic wave to the housing 152, a heating equipment, e.g., a heater, and a countermeasure of covering the heating equipment to protect the operator from this heating equipment are not necessary. Furthermore, the chamber 151 or its peripheral equipment can be fabricated without using expensive heat resistant components, leading to another advantage.

With a manufacturing apparatus having a heating equipment, the inside surface or outside surface of the housing cannot be cleaned while the interior of the chamber is kept heated or the housing is kept at a high temperature. This is because it can endanger an operator who performs the cleaning operation.

In this respect, with the chamber (manufacturing apparatus) shown in FIG. 9, even if the inside surface or outside surface of the housing is cleaned while applying an ultrasonic wave to the housing, the operator will not be exposed to high-temperature heat. If the inside surface or outside surface of the housing is cleaned while applying an ultrasonic wave to the housing, an improvement in cleaning effect can be expected.

The chamber according to the third embodiment can be modified as follows.

In the chamber shown in FIG. 9, the ultrasonic vibrator 131 is buried in the housing 152. However, the ultrasonic vibrator 131 may be mounted on either the inside surface or outside surface of the housing 152.

An equipment, e.g., a heater, which heats the interior of the housing need not be removed. It is preferable that both an equipment for heating the interior of the chamber and an equipment for applying an ultrasonic wave be provided, as shown in FIG. 9. Furthermore, when the water content remaining in the housing is removed by applying an ultrasonic wave to the housing while heating the interior of the chamber, a better effect can be obtained as compared to the method of merely applying an ultrasonic wave to the housing.

With the chamber according to the third embodiment, not only the water content in the chamber can be easily discharged, but also a material attaching to the inside surface of the housing 152 can be removed, or a material can be suppressed from attaching to the inside surface of the housing 152 by applying an ultrasonic wave to the housing 152. This is apparent from the description of the first and second embodiments.

A plasma etching apparatus according to the fourth embodiment of the present invention will be described.

The plasma etching apparatus according to the fourth embodiment has a load-lock chamber and a process chamber each employing the chamber according to the third embodiment of the present invention. As a result, a time required for evacuation can be shortened, a reaction product can be suppressed from remaining in the process chamber, and the reaction product attaching to the housing can be easily removed.

Figure 12:
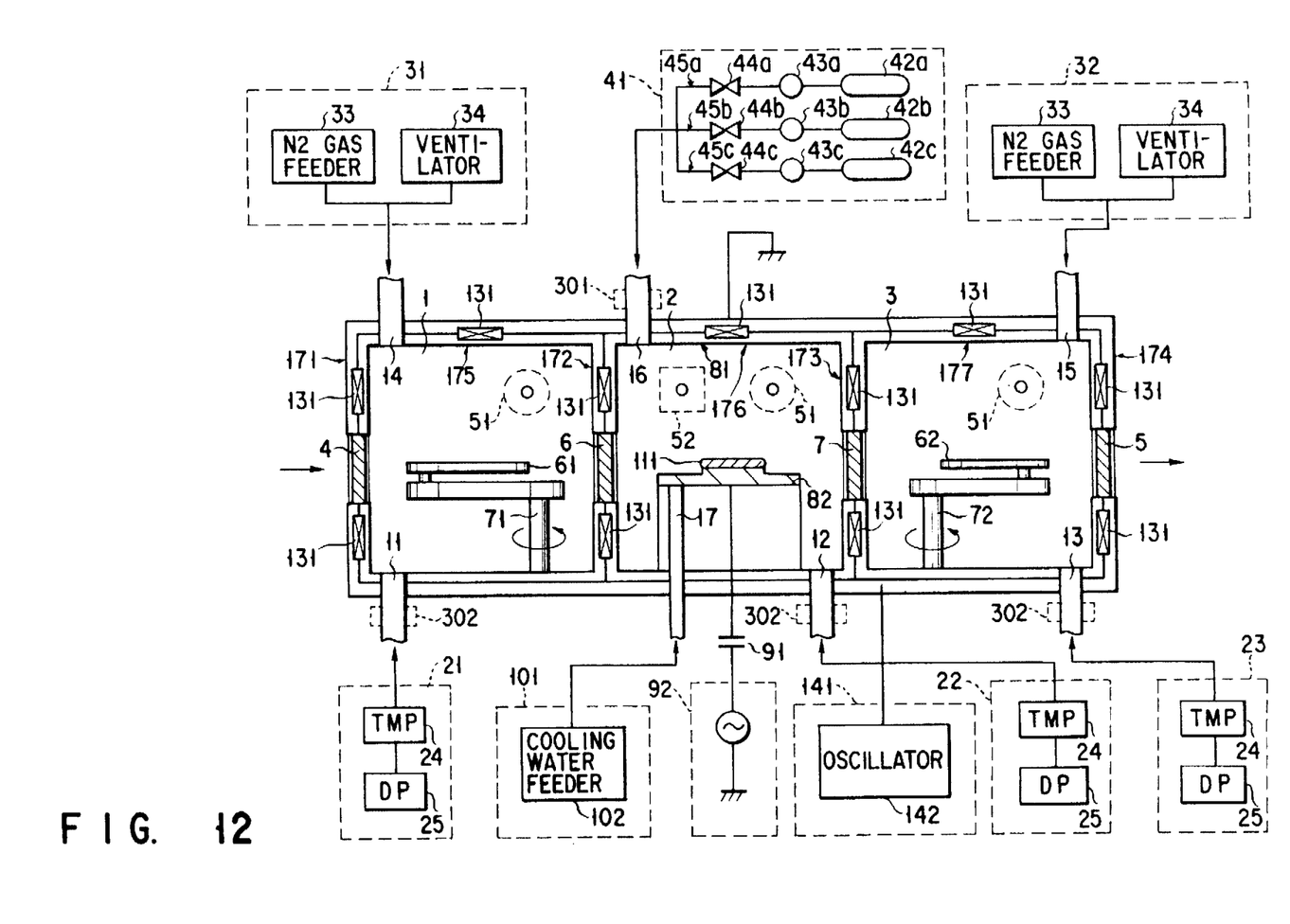
FIG. 12 is a diagram showing the arrangement of a plasma etching apparatus according to the fourth embodiment of the present invention.

FIG. 12 shows the arrangement of the plasma etching apparatus according to the fourth embodiment of the present invention. The plasma etching apparatus shown in FIG. 12 has a similar arrangement to that of the plasma etching apparatus shown in FIG. 3. The difference between the apparatus shown in FIG. 12 and the apparatus shown in FIG. 3 is that in the plasma etching apparatus shown in FIG. 12, ultrasonic vibrators 131 are provided to a housing constituting chambers 1, 2, and 3, in the same manner as in the third embodiment.

As shown in FIG. 12, each ultrasonic vibrator 131 is connected to an oscillator 142 included in a generator 141 for generating an ultrasonic wave generating electrical signal. The ultrasonic vibrator 131 vibrates upon reception of the electrical signal oscillated by the oscillator 142, thereby generating an ultrasonic wave. For example, the ultrasonic vibrators 131 are buried in the housing in a dispersed manner, and the dispersed ultrasonic vibrators 131 are connected to each other. The dispersed ultrasonic vibrators 131 are respectively arranged in a wall 171 that partitions the chamber 1 and the outside from each other, a wall 172 that partitions the chambers 1 and 2 from each other, a wall 173 that partitions the chambers 2 and 3 from each other, a wall 174 that partitions the chamber 3 and the outside from each other, a ceiling 175 of the chamber 1, a ceiling 176 of the chamber 2, and a ceiling 177 of the chamber 3. The material of the housing is, e.g., a metal containing aluminum as the base material or a metal containing stainless steel as the base material. A portion of the housing which is exposed to the processing atmosphere is coated with an inert alumina film denoted by reference numeral 153 in FIG. 9. Vibrations caused by the ultrasonic wave are transmitted to the entire portion of the housing through the metal.

An example of the operation of this apparatus will be described. In this example, a 1,000-nm thick $SiO_2$ film formed on a wafer 111 by silicon thermal oxidation is etched by using the pattern of a resist layer as the mask. The resist is a novolak resin-based photosensitive resist.

A cylinder 42a, a flow regulator 43a, a valve 44a, and a gas line 45a of a process gas feeding equipment 41 constitute the feed system of flon 14. Similarly, a cylinder 42b, a flow regulator 43b, a valve 44b, and a gas line 45b constitute the feed system of flon 23, and a cylinder 42c, a flow regulator 43c, a valve 44c, and a gas line 45c constitute the feed system of oxygen. Of these gases, flon 23 ($CHF_3$) and oxygen ($O_2$) are used as the etching gases to etch the $SiO_2$ film.

First, the wafer 111 is loaded in the load-lock chamber 1 through a gate valve 4 and is placed on a rest table 61. The gate valve 4 is closed, and an electrical signal is oscillated by the oscillator 142, so that an ultrasonic wave having a frequency of 45 kHz is generated by the ultrasonic vibrator 131. Thus, of the housing surfaces, especially surfaces opposing the load-lock chamber 1, the process chamber 2, and the load-lock chamber 3 are vibrated. At the same time, the pressure in the load-lock chamber 1, the process chamber 2, and the load-lock chamber 3 is decreased by using vacuum pumping equipments 21, 22, and 23. Subsequently, a gate valve 6 is opened, and the wafer 111 is loaded in the process chamber 2 and placed on a lower electrode 82 by using a conveyor 71. The wafer 111 is fixed on the lower electrode 82 by using an electrostatic chuck. Flon 23 ($CHF_3$) gas and oxygen ($O_2$) gas are fed into the process chamber 2 simultaneously through the gas lines 45b and 45c. The flon 23 gas is fed into the process chamber 2 at a constant flow rate of 50 SCCM, and the oxygen gas is also fed into the process chamber 2 at a constant flow rate of 50 SCCM. At this time, the pressure in the process chamber 2 is maintained at 40 mmTorr by flowing the flon 23 ($CHF_3$) gas and the oxygen ($O_2$) gas at the constant flow rate while evacuating the process chamber 2 by using the vacuum pumping equipment 22. Then, an 400-W RF power having a frequency of 13.56 MHz is applied to the lower electrode 82 by using an RF generator 92. Thus, an electric discharge phenomenon occurs between an upper electrode 81 and the lower electrode 82 so that the flon 23 ($CHF_3$) and oxygen ($O_2$) existing in the process chamber 2 are converted into a plasma, thereby etching an $SiO_2$ film (not shown) existing on the wafer 111. At this time, fluorocarbon ($CF_x$) is generated as an etching product. According to the study of the present inventors, fluorocarbon attaches to the wafer at a rate of 0.1 μm/min. Fluorocarbon also attaches to a surface of the housing which is exposed to the processing atmosphere in the process chamber 2 at a rate of 33 nm/min.

After the etching operation is ended, the wafer 111 is loaded in the load-lock chamber 3 through a gate valve 7 and placed on a rest table 62 by using a conveyor 72. Thereafter, the pressure in the load-lock chamber 3 is restored to the atmospheric pressure. Then, generation of the ultrasonic wave is stopped, and the wafer 111 is unloaded from the load-lock chamber 3 through a gate valve 5.

Figure 13:
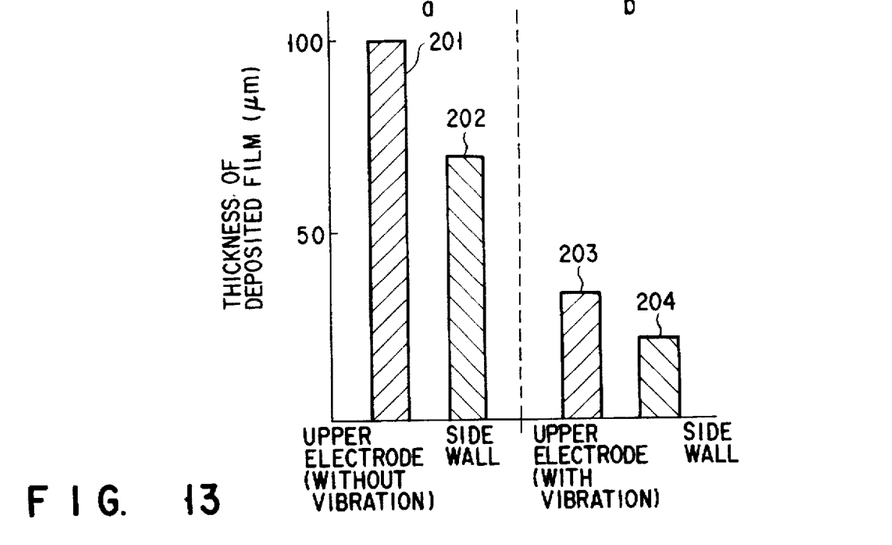
FIG. 13 is a graph showing the thickness of fluorocarbon deposited on a surface of the housing which is exposed to the processing atmosphere.

FIG. 13 is a graph showing the thickness of fluorocarbon deposited on the surface of the process chamber 2 which is exposed to the processing atmosphere. A column (a) of FIG. 13 indicates the thickness of fluorocarbon which is deposited when etching is performed without applying an ultrasonic wave to the housing. A column (b) of FIG. 13 indicates the thickness of fluorocarbon which is deposited when etching is performed while applying an ultrasonic wave to the housing.

The thickness of fluorocarbon shown in FIG. 13 is measured after 1,000 wafers are etched by employing the plasma etching apparatus shown in FIG. 12.

In the column (a) of FIG. 13, a value denoted by reference numeral 201 represents the thickness of fluorocarbon which is deposited on the upper electrode 81 (i.e., on the ceiling 176 of the housing), and a value denoted by reference numeral 202 represents the thickness of fluorocarbon which is deposited on the walls 172 and 173. Similarly, in the column (b) of FIG. 13, a value denoted by reference numeral 203 represents the thickness of fluorocarbon which is deposited on the upper electrode 81 (i.e., on the ceiling 176 of the housing), and a value denoted by reference numeral 204 represents the thickness of fluorocarbon which is deposited on the walls 172 and 173.

As shown in FIG. 13, the product generated during etching can be suppressed from attaching to a surface (inside surface) of the housing opposing the process chamber 2 by applying an ultrasonic wave to the housing. According to FIG. 13, when an ultrasonic wave is applied to the housing, the thickness of fluorocarbon deposited on the inside surface is decreased to 1/4 that deposited while an ultrasonic wave is not applied.

The reason for this is the same as the reason why the water content is suppressed from attaching to the inside surface, which has been described in the third embodiment. More specifically, when an ultrasonic wave is applied to the housing the inside surface of the housing is vibrated, so that fluorocarbon does not easily attach to the inside surface.

With the plasma etching apparatus shown in FIG. 12, when the wafer 111 is etched while applying an ultrasonic wave to the housing constituting the process chamber 2, the product generated during etching can be suppressed from attaching to a surface of the housing opposing the chamber 2.

When the etched wafer 111 is loaded in the load-lock chamber 3 while applying an ultrasonic wave to the housing constituting the load-lock chamber 3 and the ultrasonic wave is continuously applied to this housing after the wafer 111 is loaded, even if the reaction product attaching to the wafer 111 is evaporated in the load-lock chamber 3, the evaporated product can be suppressed from attaching to a surface of the housing opposing the chamber 2.

The pressure in each of the chambers 1, 2, and 3 can be decreased within a short period of time by evacuating each chamber 1, 2, or 3 while applying an ultrasonic wave to the corresponding housing. This is because the water content is suppressed from attaching to the inside surface of the corresponding housing in the same manner as in the chamber shown in FIG. 9.

The product attaching to the inside surface of the housing can be removed from the inside surface by applying an ultrasonic wave to the housing. This simplifies maintenance.

The plasma etching apparatus according to the fourth embodiment can be modified as follows.

In the plasma etching apparatus shown in FIG. 12, the ultrasonic vibrator 131 is buried in the housing. However, the ultrasonic vibrator 131 may be mounted on either the inside or outside surface of the housing.

Figure 14:
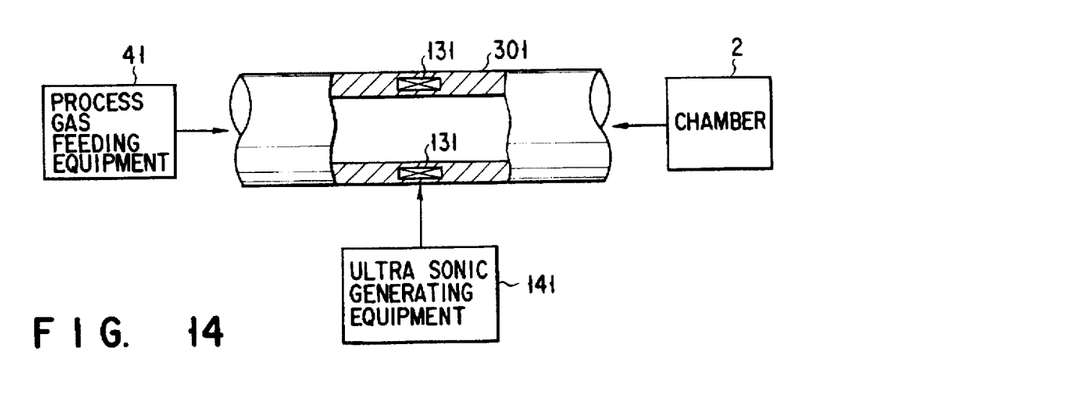
FIG. 14 is a diagram showing the arrangement of a modification of the plasma etching apparatus according to the fourth embodiment of the present invention.
Figure 15:
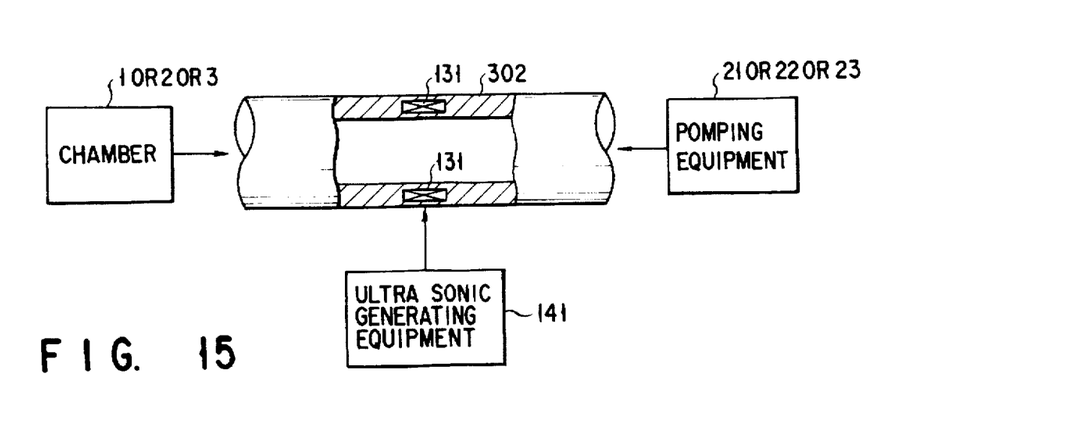
FIG. 15 is a diagram showing the arrangement of another modification of the plasma etching apparatus according to the fourth embodiment of the present invention.

An ultrasonic vibrator 131 may be provided in a pipe member 301 of the gas line, as shown in FIG. 14, or in a pipe member 302 of a gas line, as shown in FIG. 15. When the pipe member is vibrated by the ultrasonic vibrator 131 in the same manner as the housing shown in FIG. 12, the reaction product can be suppressed from remaining on the inside surface of the pipe member, and the reaction product attaching to the inside surface of the pipe member can be easily removed. The pipe member is made of a metal containing aluminum or stainless steel as the base material. A portion of the pipe member which is exposed to the process gas or exhaust gas is coated with, e.g., an inert aluminum oxide film denoted by reference numeral 153 in FIG. 9.

The pipe member 301 shown in FIG. 14 is a process gas feeding gas line used for connecting a process gas feeding equipment 41 and a process chamber 2 with each other.

The pipe member 302 shown in FIG. 15 is an evacuating gas line used for connecting a vacuum pumping equipment 21 and a load-lock chamber 1, a vacuum pumping equipment 22 and the process chamber 2, or a vacuum pumping equipment 23 and the load-lock chamber 1 with each other.

The fourth embodiment of the present invention is not limited to the plasma etching apparatus but can also be employed in, e.g., a CVD apparatus or an ashing apparatus in which a product is generated by reaction, or in other dry etching apparatuses which perform etching other than plasma etching.

The present invention has been described by way of the first, second, third, and fourth embodiments. The first, second, third, and fourth embodiments of the present invention can be used in a combination. Even if the first, second, third, and fourth embodiments of the present invention are used in a combination, the effect of the present invention will not be decreased. Taking a process time as an example, since all the effects, e.g., reduction in evacuation time, reduction in time required for a reaction process, e.g., etching, and reduction in post-treatment time, are obtained, the effect of the present invention is enhanced.

In the present invention, only 45 kHz is given as the frequency of the ultrasonic wave. However, the frequency of the ultrasonic wave can be changed within a range from the audible range on the kHz order to a higher frequency band on the MHz order.

As has been described above, the present invention can provide a semiconductor device manufacturing apparatus capable of removing a reaction product without heating a work and its removing method, a semiconductor device manufacturing apparatus capable of shortening the process time of the work and its processing method, and a semiconductor device manufacturing apparatus capable of suppressing the reaction product from remaining in the apparatus and its suppressing method.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device manufacturing apparatus comprising:

a first chamber having a loading port for loading a work therethrough;

a second chamber connected to said first chamber through a first gate;

a third chamber connected to said second chamber through a second gate and having an unloading part for unloading the work therethrough;

a processing section, provided to said second chamber, for processing the work in said second chamber;

a sonic wave applying section, provided to said third chamber, for applying a sonic wave to the work in said third chamber;

a first conveyor, provided to said first chamber, for conveying the work to said processing section through said loading port and said first gate; and a second conveyor, provided to said third chamber, for conveying the work from said processing section to said sonic wave applying section through said second gate and thereafter conveying the work from said sonic wave applying section through said unloading port.

2. An apparatus according to claim 1, wherein said sonic wave applying section includes a supporter for supporting the work; and a sonic wave applying device, connected to said supporter, for applying the sonic wave to the work through the supporter.

3. An apparatus according to claim 2, wherein the sonic wave has a frequency ranging from a kHz order to a MHz order.

4. An apparatus according to claim 2, wherein the sonic wave is an ultrasonic wave.

5. An apparatus according to claim 2, wherein said sonic wave applying device is an ultrasonic oscillator.

6. An apparatus according to claim 2, wherein said supporter is made of a metal containing either alumina or stainless steel.

7. An apparatus according to claim 2, wherein said supporter has a damper for clamping the work.

8. A method of removing a reaction product generated during manufacture of a semiconductor device from a work, comprising the steps of:

processing the work; and applying a sonic wave to the work after processing the work, thereby removing the reaction product attaching to the work while processing the work.

9. A method according to claim 8, wherein the sonic wave has a frequency ranging from a kHz order to a MHz order.

10. A method according to claim 8, wherein the sonic wave is an ultrasonic wave.

11. A method according to claim 8, wherein the work is subjected to plasma processing.

12. A method according to claim 11, wherein the reaction product is generated by plasma processing.

13. A method according to claim 8, wherein the reaction product is one of a halogen element and a compound of the halogen element.

14. A method of manufacturing a semiconductor device comprising the steps of:

loading a semiconductor wafer in a plasma processing apparatus;

plasma processing said semiconductor wafer in a plasma processing apparatus;

cleaning said semiconductor wafer by applying a sonic wave to said semiconductor wafer after plasma processing said semiconductor wafer; and unloading said semiconductor wafer from said plasma processing apparatus.

15. A method according to claim 14, wherein the sonic wave has a frequency ranging from a kHz order to a MHz order.

16. A method according to claim 14, wherein the sonic wave is an ultrasonic wave.

17. A method according to claim 14, wherein the plasma processing includes a plasma etching.

18. A semiconductor device manufacturing apparatus comprising:

a first chamber having a loading port for loading a work therethrough;

a second chamber connected to said first chamber through a first gate;

a third chamber connected to said second chamber through a second gate and having an unloading part for unloading the work therethrough;

a processing section, provided only to said second chamber, for processing the work in said second chamber;

a sonic wave applying section, provided to said third chamber, for applying a sonic wave to the work in said third chamber;

a first conveyor, provided to said first chamber, for conveying the work to said processing section through said loading port and said first gate; and a second conveyor, provided to said third chamber, for conveying the work from said processing station to said sonic wave applying section through said second gate and thereafter conveying the work from said sonic wave applying section through said unloading port.

* * * * *